United States Patent [19]

Morozowich et al.

[11] 4,321,485
[45] Mar. 23, 1982

[54] HIGH-FREQUENCY TRANSISTOR SWITCH

[75] Inventors: Merle Morozowich, Irwin, Pa.; Richard L. Bonkowski, Milwaukee, Wis.

[73] Assignee: Westinghouse Electric Corp., Pittsburgh, Pa.

[21] Appl. No.: 160,243

[22] Filed: Jun. 17, 1980

[51] Int. Cl.³ .................. H03K 29/90; H03K 17/60
[52] U.S. Cl. .................. 307/300; 307/253; 307/319
[58] Field of Search ........... 307/300, 280, 253, 319, 307/281; 357/16, 46

[56] References Cited

U.S. PATENT DOCUMENTS

| 3,530,285 | 4/1976 | Sakamoto et al. | 307/300 |
| 3,566,158 | 2/1971 | Paine | 307/300 |
| 3,710,041 | 1/1973 | Hayashi et al. | 307/300 |
| 4,035,670 | 7/1977 | Roman | 307/300 |

FOREIGN PATENT DOCUMENTS 54-148466  11/1979  Japan .................. 307/300

Primary Examiner—Stanley D. Miller, Jr.
Assistant Examiner—B. P. Davis
Attorney, Agent, or Firm—C. L. Menzemer

[57] ABSTRACT

A common Baker Clamp includes diodes having predetermined reverse-recovery times for responding to a signal having a high frequency on the order of 100 kHz. A pair of anti-parallel diodes coupled between an input terminal and a first output terminal are each characterized by a reverse-recovery time on the order of 2μs. A third diode is coupled between the input terminal and a second output terminal and is characterized by a reverse-recovery time on the order of 200 ns.

4 Claims, 2 Drawing Figures

HIGH-FREQUENCY TRANSISTOR SWITCH

BACKGROUND OF THE INVENTION

1. Field of the Invention

The present invention relates to a circuit for improving the switching time of a power transistor, and in particular, to a circuit for maintaining a switching transistor in a quasi-saturation condition.

2. Description of the Prior Art

In commonly used switching circuits such as inverters, when two or more power transistors are utilized, there is a potential condition of "simultaneous conduction", wherein two power transistors are simultaneously in the "ON" state causing a direct short across the power line. This simultaneous conduction phenomenon is due to the storage time ($t_s$) of the power transistor. Storage time is the delay between the time a "turn-off" signal is applied to the transistor and the time that the transistor actually begins to turn off. Because this storage time is variable, even among transistors of the same type, it is usually difficult to ensure that a two-transistor circuit, which is supposed to switch alternately, will actually prevent conditions of simultaneous conduction, i.e., one transistor is turning "ON" while the other is still partially "ON".

One solution to the problem is to reduce the value of $t_s$ to virtually zero by preventing saturation in the power transistor. A circuit commonly known as a Baker Clamp has been used for such a purpose. However, such circuits discussed in the literature do not specify key component characteristics (performance parameters). For example, it is not clear which of the diodes utilized in the Baker Clamp should be fast and which of them can be slow, especially in high-frequency operation. Nor is it clear that particular benefits are derived from specifying such characteristics. In addition, the stray inductance caused by the wires of the Baker Clamp coupled to the power transistor degrade the maximal recovery time ($t_r$) and turn-off time ($t_f$) in the power transistor.

SUMMARY OF THE INVENTION

An inverter circuit having an input and two outputs for switching a transistor in response to a high-frequency signal comprises first and second diode means coupled in anti-parallel between the input terminal and an output terminal. A third diode is coupled between the input terminal and the other output terminal. The first and second diode means are each characterized by a reverse-recovery time on the order of $2\mu s$ and the third diode means is characterized by a reverse-recovery time on the order of 200 ns in order that the circuit will best respond to the high-frequency signal.

DESCRIPTION OF THE PREFERRED EMBODIMENT

Figure 1:
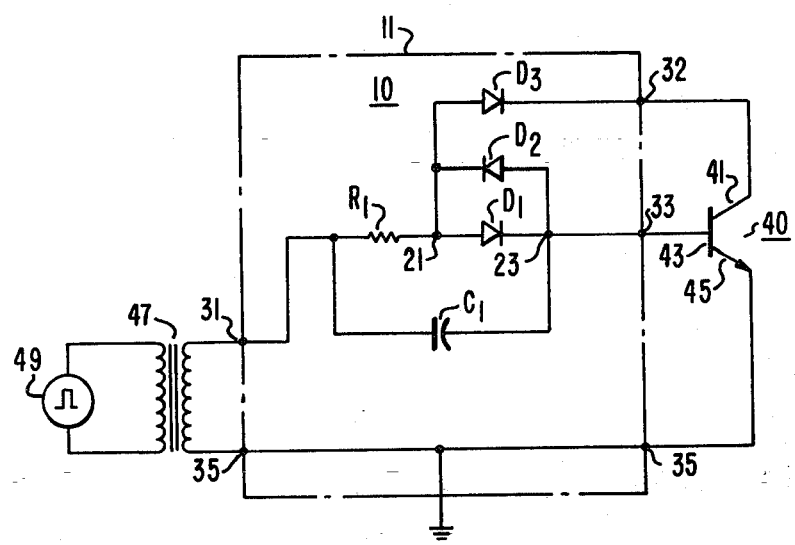
FIG. 1 shows a schematic of a circuit according to the teachings of the present invention.

FIG. 1 shows an inverter circuit 10 within the dashed lines 11 according to the teachings of the present invention. The inverter circuit 10 operates in the Class D (switching) mode, is capable of operating in the 20 KHz to 100 KHz range of input signal frequencies, and can switch currents of 50 to 60 amperes at 300 volts. The circuit 10 includes an input terminal 31 and output terminals 32 and 33. In FIG. 1, a transistor 40, for example, of the type D60T includes a collector 41 coupled to the output terminal 32, a base 43 coupled to the output terminal 33, and an emitter 45 coupled to ground. A transformer 47 is included for coupling a signal from a signal source 49 to the circuit input 31 and thereby providing a base current for the transistor 40. The base current can be provided by, for example, a circuit including Ferranti ZN1066 switching regulator control and drive circuit. The oscillator for the ZN1066, that is the signal source 49, is adjustable and is capable of driving 120 mA.

The circuit 10 includes a diode means $D_1$ for providing a voltage drop to raise the transistor 40 out of saturation. Commonly, the diode means $D_1$ includes two or more series-coupled diodes. However, a trade off in performance is required in determining the number of diodes for diode means $D_1$. Typically, the more diodes in series, the lower the storage time and the faster the switching time, but the greater the power dissipation. On the other hand, fewer diodes in series result in a comparatively higher storage time and, thereby, a slower switching time. It is preferred that each diode in the diode means $D_1$ have a reverse-recovery time $t_{rr}$ on the order of 2 $\mu s$ in order that the circuit 10 will best respond to the higher frequencies from the signal source 49 on the order of 100 kHz contemplated in the teachings of the present invention.

The circuit 10 also includes a diode means $D_2$ coupled in anti-parallel to the diode means $D_1$ for providing a path for turn-off current. The diode means $D_1$ and $D_2$ are coupled together such that the anode of the diode means $D_1$ and the cathode of the diode means $D_2$ are coupled to a node 21 and such that the anode of the diode means $D_2$ and the cathode of the diode means $D_1$ are coupled to a node 23. It is preferred that the diode means $D_2$ have a reverse-recovery time on the order of 2 $\mu s$ in order that the circuit 10 will best respond to the higher frequencies from the signal source 49 on the order of 100 kHz contemplated in the teachings of the present invention. The reverse-recovery time of both the diode means $D_1$ and $D_2$ may not be much slower than 2 $\mu s$ without deteriorating the performance of the circuit 10 at the contemplated frequencies. The reverse-recovery time of both the diode means $D_1$ and $D_2$ may be faster than 2 $\mu s$. However, according to the teachings of the present invention, the reverse-recovery time of the diode means $D_1$ and $D_2$ may be relatively slow, and the efficient operation of the circuit 10 at the frequencies contemplated does not require a reverse-recovery time any faster than 2 $\mu s$ for the diode means $D_1$ and $D_2$. Moreover, the use of a diode having a reverse-recovery time faster than 2 $\mu s$ may unnecessarily increase the total cost of the circuit 10.

A diode means $D_3$ is coupled between the node 21 and the output terminal 32 such that the cathode is coupled to the terminal 32 and the anode is coupled to the node 21. It is preferred that the diode means $D_3$ have a reverse-recovery time on the order of 200 ns in order that the circuit 10 will best respond to the higher frequencies from the signal source 49 on the order of 100 kHz contemplated in the teachings of the present invention.

Figure 2:
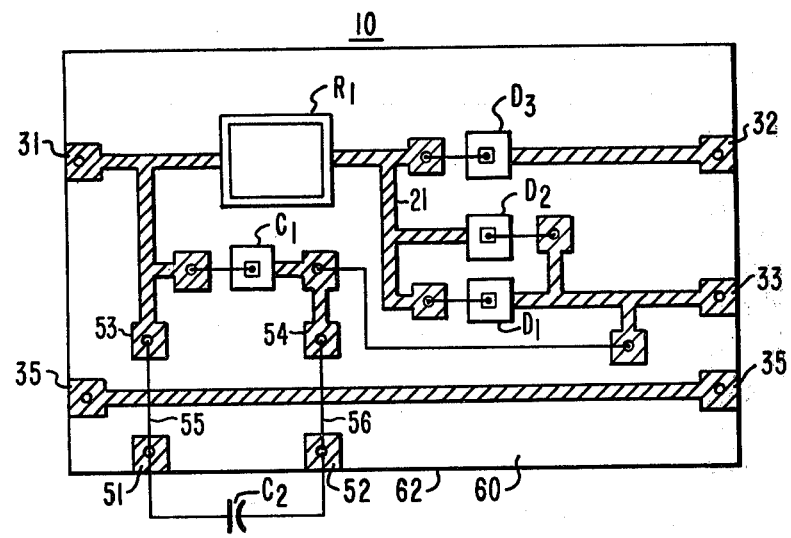
FIG. 2 shows a preferred embodiment of the circuit of FIG. 1.

A preferred embodiment of the invention is shown in FIG. 2. Similar reference characters are used to designate like elements as described in FIG. 1. FIG. 2 shows a non-conductive substrate material 60, for example berylia or alumina, on which is etched a pattern of metal deposits and strips for connecting the circuit elements shown in FIG. 1. A preferred metal for connecting the circuit elements is copper. Generally, the copper connections in FIG. 2 can be formed by placing a silk screen or photo-resist screen on a copper-clad surface of a printed circuit board and etching out the unwanted copper thereby leaving the copper circuit pattern as shown in FIG. 2. Diodes $D_1$ through $D_3$ can be, for example, diode chips placed on appropriate pads and soldered in order to connect the bottom side of the chips to the copper circuit pattern. Interconnecting wiring can be ultrasonically bonded or soldered in order to connect the top side of the chips to the copper circuit pattern. For example, diode chips $D_1$ and $D_3$ are soldered on the bottom (cathode) side at node 23; the top anode side of each diode chip $D_1$ and $D_3$ is wired to the node 21. The diode chip $D_2$ is soldered on the bottom (cathode) side at node 21 and the top (anode) side thereof is wired to the node 23. Similar to diode chips $D_1$, $D_2$, and $D_3$, capacitor $C_1$ can be a capacitor chip placed on an appropriate pad and connected in a manner similar to that for diodes $D_1$–$D_3$. For example, capacitor chip $C_1$ is soldered on one (bottom) side on a pad connected to node 23; the other (top) side of the capacitor chip $C_1$ is wired to a pad connected to the terminal 31. As shown in FIG. 2, the capacitance $C_1$ can be variably increased by adding an external capacitor $C_2$ in parallel with the capacitor $C_1$. In order to connect the capacitor $C_2$ in parallel with the capacitor $C_1$ copper pads 51 and 52 are formed on or near an edge 62 of the substrate 50, between which copper pads 51 and 52 is coupled the capacitor $C_2$. The copper pads 51 and 52 are coupled to copper pads 53 and 54, respectively, by wiring connections 55 and 56, respectively.

The resistor $R_1$ of FIG. 2 is a thick-film resistor which can be formed by depositing a thick-film resistor paste between the nodes 32 and 21 and then trimming the paste to provide the desired resistivity. The capacitor $C_1$ can be a capacitor chip which can be soldered on in much the same manner as the diodes $D_1$ and $D_4$ are soldered on.

What we claim is:

1. A circuit for switching a transistor in response to a signal, said transistor having a collector, a base, and an emitter, said circuit comprising:
    (a) an input terminal for coupling said circuit to said signal, a first output terminal for coupling said circuit to the base of said transistor, and a second output terminal for coupling said circuit to the collector of said transistor;
    (b) first and second diode means coupled in anti-parallel between said input terminal and said first output terminal, said first and second diode means each having a reverse-recovery time on the order of 2 $\mu$s,
    (c) a third diode means coupled between said input terminal and said second output terminal, said third diode having a reverse-recovery time on the order of 200 ns.

2. A circuit for switching a transistor in response to a signal having a frequency on the order of 100 kHz, said transistor having a collector, a base, an emitter, said circuit comprising:
    (a) an input terminal for coupling said circuit to said signal, a first output terminal for coupling said circuit to the base of said transistor, and a second output terminal for coupling said circuit to the collector of said transistor;
    (b) first and second diode means coupled in anti-parallel between said input terminal and said first output terminal, said first and second diode means each having a reverse-recovery time on the order of 2$\mu$,
    (c) a third diode means coupled between said input terminal and said second output terminal, said third diode having a reverse-recovery time on the order of 200 ns.

3. A circuit according to claim 2 further including:
    (a) a resistor coupled between said input terminal and said first and second diode means; and
    (b) a capacitor coupled in parallel across said resistor and said first and second diode means.

4. A circuit for switching a transistor in response to a signal, said transistor having a collector, a base, and an emitter, said circuit comprising:
    (a) a non-conductive substrate
    (b) first, second and third semiconductor diode chips on said substrate, each of said diode chips having a reverse-recovery time, and each having, on a bottom surface, a cathode electrode on said substrate, and having on a top surface an anode electrode, the reverse-recovery times of said first and second diode chips being on the order of 2 $\mu$s, the reverse-recovery time of said third diode chip being on the order of 200 ns;
    (c) a thick-film resistor on said substrate;
    (d) a capacitor chip on said substrate, said capacitor chip having two conducting surfaces, one of said conducting surfaces on said substrate;
    (e) means on said substrate for coupling the anode of said first diode chip to said thick-film resistor, and means on said substrate for coupling the cathode of said first diode chip to the base of said transistor;
    (f) means on said substrate for coupling the anode of said second diode chip to the base of said transistor, and means on said substrate for coupling the cathode of said second diode chip to said thick-film resistor;
    (g) means on said substrate for coupling the anode of said third diode chip to the collector of said transistor, and means on said substrate for coupling the cathode of said third diode chip to said thick-film resistor;
    (h) means on said substrate for coupling said capacitor chip to said signal, and means for coupling the other conducting surface of said capacitor chip to the base of said transistor;
    (i) means on said substrate for coupling said thick-film resistor to said signal.

* * * * *